(12) United States Patent
Kim et al.

(10) Patent No.: US 7,496,270 B2
(45) Date of Patent: Feb. 24, 2009

(54) LIGHT EMITTING UNIT, APPARATUS AND METHOD FOR MANUFACTURING THE SAME, APPARATUS FOR MOLDING LENS THEREOF, AND LIGHT EMITTING DEVICE PACKAGE THEREOF

(75) Inventors: Yong Suk Kim, Seoul (KR); Hoon Hur, Gyeonggi-do (KR)

(73) Assignees: LG Electronics Inc., Seoul (KR); LG Innotek Co., Ltd., Seoul (KR)

( * ) Notice: Subject to any disclaimer, the term of this patent is extended or adjusted under 35 U.S.C. 154(b) by 0 days.

(21) Appl. No.: 11/707,112

(22) Filed: Feb. 16, 2007

(65) Prior Publication Data

US 2007/0286550 A1    Dec. 13, 2007

(30) Foreign Application Priority Data

Jun. 9, 2006    (KR) ............... 10-2006-0052037

(51) Int. Cl.
*G02B 6/00*    (2006.01)

(52) U.S. Cl. ........................................ 385/147

(58) Field of Classification Search ............... None
See application file for complete search history.

(56) References Cited

U.S. PATENT DOCUMENTS 6,482,664 B1    11/2002    Lee et al.
6,734,465 B1    5/2004    Taskar et al.
2006/0252169 A1*    11/2006    Ashida .................. 438/29

FOREIGN PATENT DOCUMENTS

| EP | 0 539 109 A1 | 4/1993 |
|----|---|---|
| EP | 0 632 511 A2 | 1/1995 |
| JP | 61034985 A * | 2/1986 |
| JP | 63-089313 A | 4/1988 |
| JP | 06334224 A * | 12/1994 |
| WO | WO 2005/056269 A2 | 6/2005 |

* cited by examiner

*Primary Examiner*—Sung H Pak
(74) *Attorney, Agent, or Firm*—Birch, Stewart, Kolasch & Birch, LLP

(57) ABSTRACT

A light emitting unit, an apparatus and method for manufacturing the same, an apparatus for molding a lens thereof, and a light emitting device package thereof, which are capable of achieving an enhancement in light extraction efficiency and an improvement in mass productivity, are disclosed. The light emitting unit manufacturing apparatus includes a mold including a first mold and a second mold coupled to each other under a condition in which at least one light emitting unit is interposed between the first and second molds, a groove formed in one of the first and second molds at a position facing the light emitting unit, the groove having a lens shape, and a passage extending from an outer surface of the mold to the groove.

17 Claims, 5 Drawing Sheets

LIGHT EMITTING UNIT, APPARATUS AND METHOD FOR MANUFACTURING THE SAME, APPARATUS FOR MOLDING LENS THEREOF, AND LIGHT EMITTING DEVICE PACKAGE THEREOF

This application claims the benefit of Korean Patent Application No. 10-2006-0052037, filed on Jun. 9, 2006, which is hereby incorporated by reference as if fully set forth herein.

BACKGROUND OF THE INVENTION

1. Field of the Invention

The present invention relates to a light emitting unit, an apparatus and method for manufacturing the same, an apparatus for molding a lens thereof, and a light emitting device package thereof, and more particularly, to a light emitting unit, an apparatus and method for manufacturing the same, an apparatus for molding a lens thereof, and a light emitting device package thereof which are capable of achieving an enhancement in light extraction efficiency and an improvement in mass productivity.

2. Discussion of the Related Art

Generally, liquid crystal display (LCD) devices, which are a kind of light reception type flat display, have no ability to emit light by itself. For this reason, such an LCD device forms an image by selectively transmitting illumination light irradiated from the external of the LCD device. To this end, a light source must be arranged at the back side of the LCD device, in order to illuminate the LCD device. This light source is called a "backlight unit (BLU)".

Such a backlight unit must uniformly irradiate light over the overall surface of a liquid crystal panel. To this end, where light emitting diodes (LEDs) are used for light emitters of the backlight unit, it is necessary to arrange a lens on a package of each LED, in order to obtain a uniform brightness distribution of illumination light.

For an example of a method for installing a lens on an LED package, there is a method in which a lens is injection-molded using an epoxy resin or polycarbonate (PC)-based resin, and the molded lens is attached to an LED package.

The attachment of the lens to the LED package may be achieved using a method shown in FIG. 1. That is, as shown in FIG. 1, an encapsulate material 11 is filled in a region defined over an LED 12 of an LED package 10, and a lens 20 is then attached to an upper surface of the LED package 10 filled with the encapsulate material 11.

In this case, for the encapsulate material 11 of the LED package 10, a material such as silicon is used. However, when the lens 20, which is made of an epoxy resin or a PC-based material, is attached to the encapsulate material 11 which is a silicon, the following problems may occur.

First, when the lens 20 is made of an epoxy resin, it has no bonding force to silicon, which is used for the encapsulate material 11. For this reason, an air layer is formed between the two materials.

When an air layer is formed between the two materials, as mentioned above, light may be totally reflected while passing through the silicon encapsulate material 11 and the epoxy resin lens 20. As a result, a part of light emerging from the LED 12 cannot directly reach the lens 20.

Since the light travels along a complex path between the encapsulate material 11 and the lens 20 due to such a total reflection phenomenon, the number of light beams finally emerging out of the LED package 10 is reduced. As a result, a reduction in light amount occurs. For this reason, practically, a degradation in brightness occurs.

Furthermore, when the epoxy resin used for the lens 20 is exposed to a high temperature condition for a prolonged period of time, a yellowing phenomenon may occur. For this reason, when the lens 20 may be discolored in the manufacture thereof, so that it may function as a main factor of a degradation in light amount.

Second, when the lens 20 is injection-molded using a PC-based resin, interfaces are formed between the silicon encapsulate material 11 and the PC lens 20, similarly to the former case. Due to a full reflection phenomenon occurring at the interfaces, a degradation in the light amount of the LED package 10 may occur.

Meanwhile, in the case of a modulized LED package, it is generally formed using a reflow process. A temperature increase to about 270° C. may occur during the reflow process.

However, in association with the PC lens 20, there is a difficulty in executing the reflow process. This is because the material of the PC lens 20 is a thermoplastic resin, so that the PC lens 20 may be deformed at a temperature of 160° C. or more due to melting thereof.

SUMMARY OF THE INVENTION

Accordingly, the present invention is directed to a light emitting unit, an apparatus and method for manufacturing the same, an apparatus for molding a lens thereof, and a light emitting device package thereof that substantially obviate one or more problems due to limitations and disadvantages of the related art.

An object of the present invention is to provide a light emitting unit, an apparatus and method for manufacturing the same, an apparatus for molding a lens thereof, and a light emitting device package thereof which are capable of basically solving formation of interfaces between a lens and an encapsulate, and thus, achieving a maximum light extraction efficiency and an improvement in mass productivity.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a light emitting unit manufacturing apparatus comprise: a mold including a first mold and a second mold coupled to each other under a condition in which at least one light emitting unit is interposed between the first and second molds; a groove formed in one of the first and second molds at a position facing the light emitting unit, the groove having a lens shape; and a passage extending from an outer surface of the mold to the groove.

In another aspect of the present invention, an apparatus for molding lenses on light emitting units comprises: a mold including a first mold and a second mold coupled to each other under a condition in which the light emitting units are interposed between the first and second molds; grooves formed in one of the first and second molds at positions facing the light emitting units, respectively, each groove having a lens shape; a passage extending from an outer surface of the mold to the grooves; and an injection port connected to the passage.

In another aspect of the present invention, a light emitting device package comprises: a package body on which a light emitting device is mounted; and a lens directly molded on the package body mounted with the light emitting device, wherein there is no interface between the lens and the package body.

In another aspect of the present invention, a light emitting device package comprises: a package body on which a light emitting device is mounted; a filler arranged on the package body; and a lens molded integrally with the filler.

In another aspect of the present invention, a method for manufacturing a light emitting unit comprises simultaneously molding a filler and a lens on the light emitting unit.

In still another aspect of the present invention, a method for manufacturing a light emitting device package comprises: mounting a light emitting device on a package body; and directly molding a lens on the light emitting device mounted on the package body.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Figure 1:
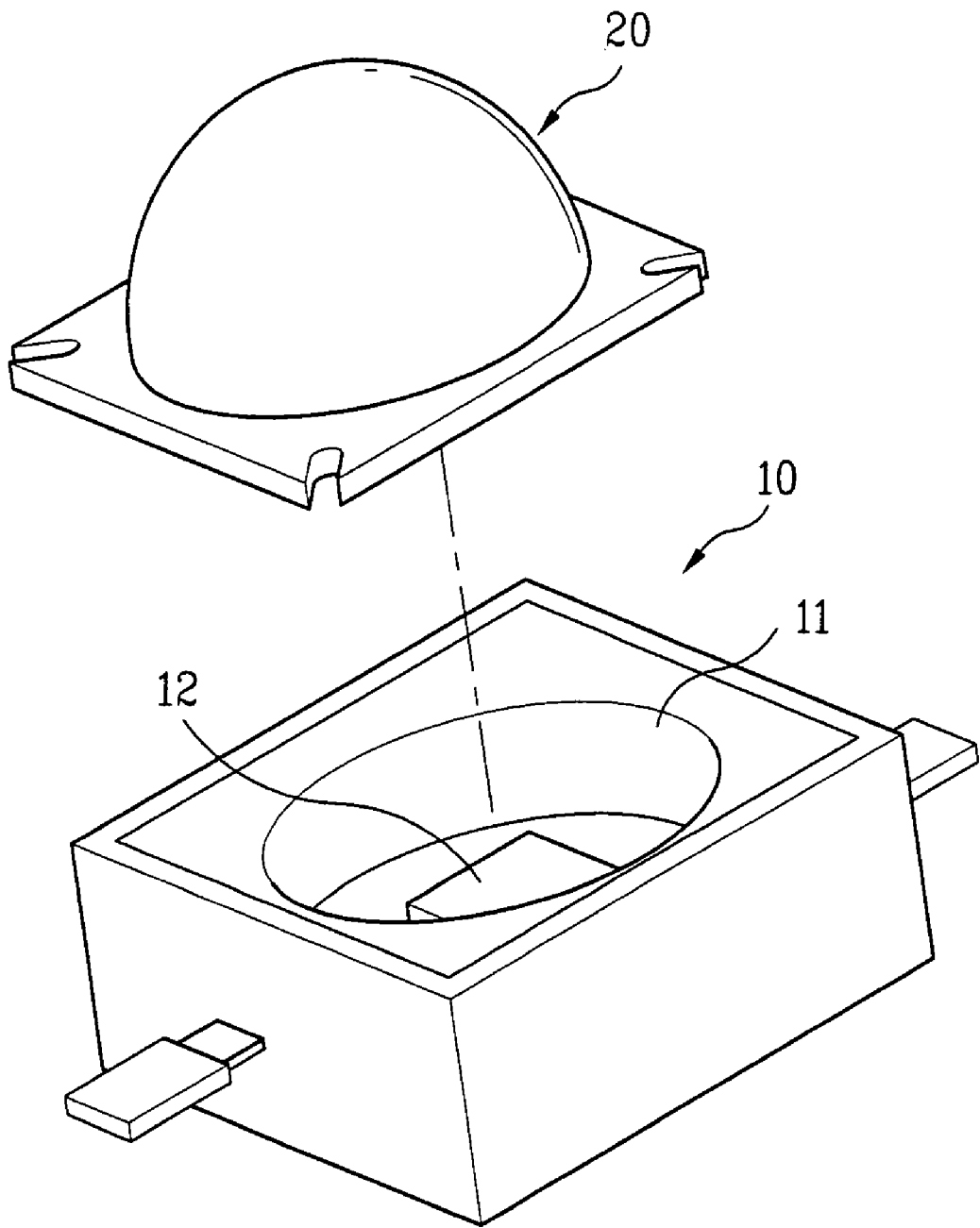
FIG. 1 is an exploded perspective view illustrating a conventional method used to attach a lens to a light emitting diode.

Reference will now be made in detail to the preferred embodiments of the present invention, examples of which are illustrated in the accompanying drawings.

The present invention may, however, be embodied in many alternate forms and should not be construed as limited to the embodiments set forth herein. Accordingly, while the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention as defined by the claims.

Like numbers refer to like elements throughout the description of the figures. In the drawings, the thickness of layers and regions are exaggerated for clarity.

It will be understood that, although the terms first, second, etc. may be used herein to describe various elements, components, regions, layers and/or sections, these elements, components, regions, layers and/or sections should not be limited by these terms.

These terms are only used to distinguish one region, layer or section from another region, layer or section. Thus, a first region, layer or section discussed below could be termed a second region, layer or section, and similarly, a second region, layer or section may be termed a first region, layer or section without departing from the teachings of the present invention.

First Embodiment

Figure 2:
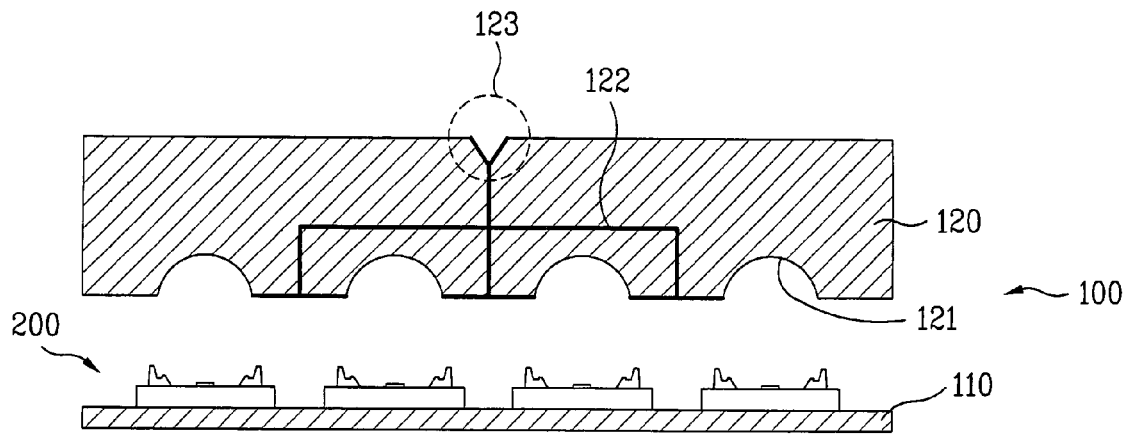
FIG. 2 is a sectional view illustrating a first embodiment of the present invention.

Referring to FIG. 2, a mold 100 according to a first embodiment of the present invention is illustrated. The mold 100 includes two parts coupled to each other while receiving light emitting units 200 therebetween.

In detail, the mold 100 includes a first mold 110 and a second mold 120. Lens-shaped grooves 121 are formed in one of the first and second molds 110 and 120 at positions corresponding to the light emitting units 200, respectively. A passage 122 is formed in the mold 100 such that the passage 122 is connected to the grooves 121.

Each groove 121 is formed to have a shape correspond to an engraved shape of the lens to be formed on each light emitting unit 200.

The grooves 121 and passage 122 may be provided at any one of the first and second molds 110 and 120. For simplicity of description, the following description will be given in conjunction with the case in which the grooves 121 and passage 122 are provided at the second mold 120.

The passage 122 connects the grooves 121 to the outside of the second mold 120 formed with the passage 122. Preferably, an injection port 123 is formed at an outer end of the passage 122.

The passage 122 includes a plurality of branch passages branched from the injection port 123 to respective grooves 121. Preferably, the branch passages are identical in terms of a length extending from the injection port 123 to each groove 121.

The injection port 123 may be formed at the second mold 120 where the passage 122 is formed. The injection port 123 may have a diameter larger than that of the passage 122. As shown in FIG. 2, the injection port 123 may have a funnel shape.

The light emitting units 200 are arranged on the first mold 110 such that the lens-shaped grooves 121 are positioned on the light emitting units 200, respectively, when the first and second molds 110 and 120 are coupled to each other.

A plurality of light emitting units 200 may be arranged on the first mold 110, as shown in FIG. 2. Accordingly, a plurality of lens-shaped grooves may also be arranged.

Each light emitting unit 200 may be a light emitting diode (LED) package including a lead frame. The light emitting units 200 may also be LEDs arranged on a printed circuit board (PCB).

Accordingly, a plurality of lenses can be simultaneously molded on the upper surfaces of the light emitting unit 200, respectively, by coupling the first and second molds 110 and 120, and injecting a material for formation of the lenses into the injection port 123, thereby molding the lenses.

Figure 3:
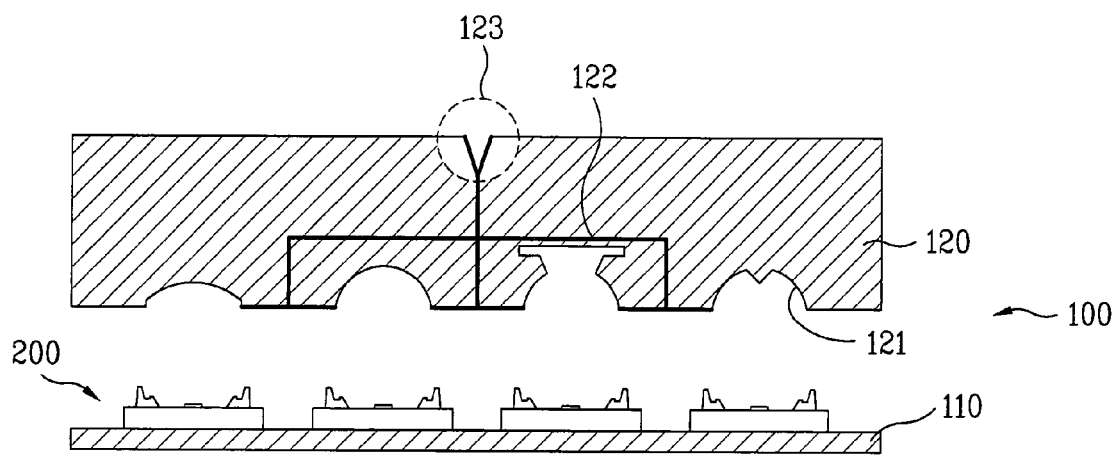
FIG. 3 is a sectional view illustrating another example of a lens-shaped groove according to the present invention.
Figure 4:
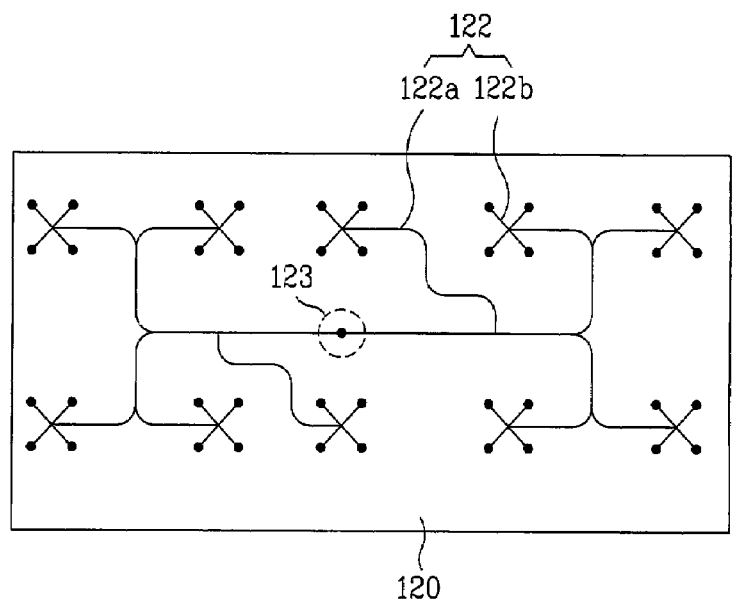
FIG. 4 is a plan view illustrating an example of a passage according to the present invention.

Meanwhile, various lens shapes may be applied to the lens-shaped grooves 121 formed in the second mold 120, as shown in FIG. 3.

Using the second mold 120 which includes grooves 121 having different lens shapes, as described above, it is possible to simultaneously mold lenses having different shapes. In this case, it is possible to obtain various light combinations, using lenses of various shapes.

As described above, the passage 122 may be formed such that the lengths from the injection port 123 to respective grooves 121 are identical. Also, the passage 122 may be branched to group the grooves 121 or light emitting units 200 into groups each including at least two grooves 121 or light emitting units 200.

In this arrangement, there is an advantage in forming the passage 122 such that the lengths from the injection port 123 to respective grooves 121 are identical. The passage 122 may include first passages 122a each extending from the injection port 123 to an entrance of the associated group where the associated grooves 121 are distributed, and second passages 122b branched from each first passage 122a, and respectively connected to the grooves 121 of the group associated with the first passage 122a.

A liquid material for molding of lenses flows along the passage 122 after being injected into the injection port 123. In this case, the liquid material are injected from the injection port 123 into the grooves 121 at the same pressure. If the lengths of the passage 122 from the injection portion 123 to respective grooves 121 are different from each other, it is difficult to achieve uniform injection of the liquid material.

The first and second molds 110 and 120 are coupled to each other under the condition in which the light emitting units 200 are interposed between the first and second molds 110 and 120. The injection port 123 is then connected to an injection molding machine (not shown), in order to fill the liquid material in a space between the first and second molds 110 and 120, namely, a space defined by the lens-shaped grooves 121 and light emitting units 200.

The liquid material for molding of lenses is then injected into the mold 100 by the injection molding machine. The injected liquid material is injected into the space between the first mold 110 having the grooves 121 and the second mold 120.

The injected liquid material for molding of lenses is then cured. Thus, lenses are molded on the light emitting units 200 in a bonded state, respectively.

Second Embodiment

Figure 5:
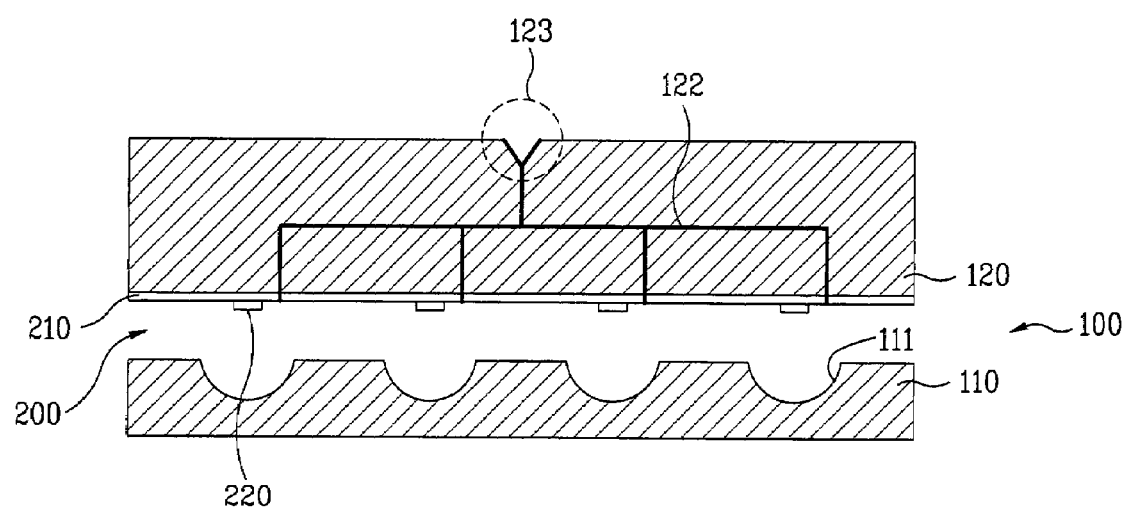
FIG. 5 is a sectional view illustrating a second embodiment of the present invention.

Referring to FIG. 5, a mold 100 according to a second embodiment of the present invention is illustrated. The mold 100 includes a first mold 110 and a second mold 120. Lens-shaped grooves 121 are formed in the first mold 110 of the mold 100. A light emitting unit 200 is arranged on the second mold 120.

Passages 122 are formed in the second mold 120 such that the passage 122 is connected to the grooves 111, as in the first embodiment. An injection port 123 is formed at an outer end of the passage 122.

The light emitting unit 200, which is attached to the second mold 120, may comprise a plurality of light emitting diodes (LEDs) or LED packages. In particular, for the light emitting unit 200, a plurality of LED packages 220 mounted on a printed circuit board (PCB) 210 may be used.

Where the LED packages 220 mounted on the PCB 210 are arranged on the second mold 120, it is preferred that the PCB 210 be connected to the passage 122.

The lens-shaped grooves 111 are arranged in the first mold 110 at positions corresponding to the LED packages 220, respectively. Each lens-shaped groove 111 is shaped to completely cover the associated LED package 220.

The first and second molds 110 and 120 are coupled to each other under the condition in which the light emitting unit 200 is interposed between the first and second molds 110 and 120. The injection port 123 is then connected to an injection molding machine (not shown), in order to fill a liquid material for molding of lenses in a space between the first and second molds 110 and 120, namely, a space defined by the lens-shaped grooves 121 and light emitting unit 200.

The liquid material for molding of lenses is then injected into the passage 122 of the mold 100 by the injection molding machine. The injected liquid material is injected into the space between the first mold 110 having the grooves 111 and the second mold 120.

The injected liquid material for molding of lenses is then cured. Thus, lenses are molded on the light emitting unit 200 in a bonded state.

The remaining configurations in this embodiment are identical to that of the first embodiment, so that no description thereof will be given.

Third Embodiment

Where the LED packages 220 mounted on the PCB 210 are used for the light emitting unit 200, leads are printed on the PCB 210 to configure a desired circuit.

In this case, when the first and second molds 110 and 120 are coupled to each other, a pressure of several tons is applied to the leads printed on the PCB 210. As a result, the leads may be damaged.

Figure 6:
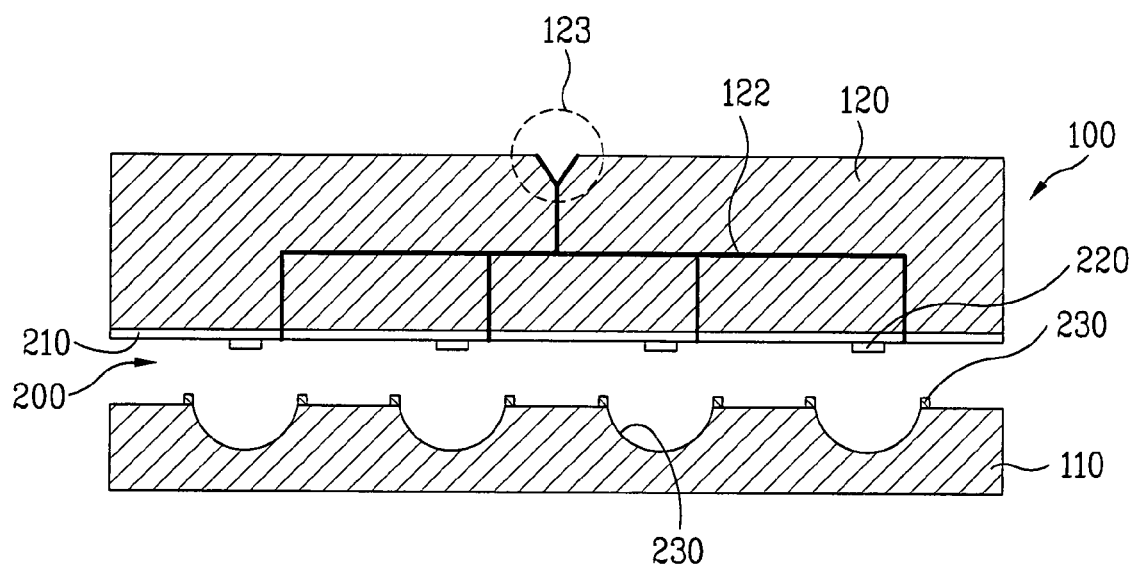
FIG. 6 is a sectional view illustrating a third embodiment of the present invention.
Figure 7:
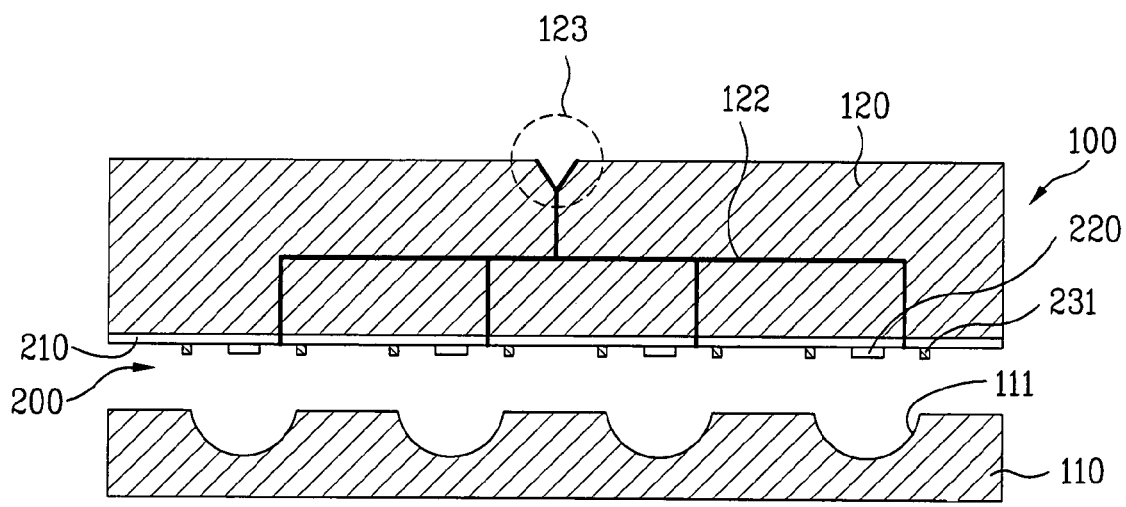
FIG. 7 is a sectional view illustrating a modification of the third embodiment of the present invention.

In order to prevent the leads of the PCB 210 from being damaged due to the coupling pressure between the first and second molds 110 and 120, PCB protectors 230 or 231, which are made of a material having an elasticity, may be provided at contact portions of the mold or PCB 210, as shown in FIG. 6 or 7.

As shown in FIG. 6, each PCB protector 230 may be arranged around the associated lens-shaped groove 111 while having the same shape as the lens-shaped groove 111. In particular, each PCB protector 230 may be formed in the form of a strip extending along the periphery of the associated lens-shaped groove 111.

Alternatively, PCB protectors 231 may be formed on the PCB 210, as shown in FIG. 7. The PCB protectors 231 formed on the PCB 210 function to alleviate the pressure applied between the PCB 210 and the first mold 110 when the first and second molds 110 and 120 are coupled to each other.

Meanwhile, the PCB protectors 231 may have the form of circular protrusions having a height larger than that of the leads on the PCB 210.

Hereinafter, a method for manufacturing light emitting units including lenses, using a light emitting unit manufacturing apparatus according to the present invention, will be described. The following description will be given in conjunction with the case in which a single light emitting unit 200 including a plurality of lenses is manufactured.

Figure 8:
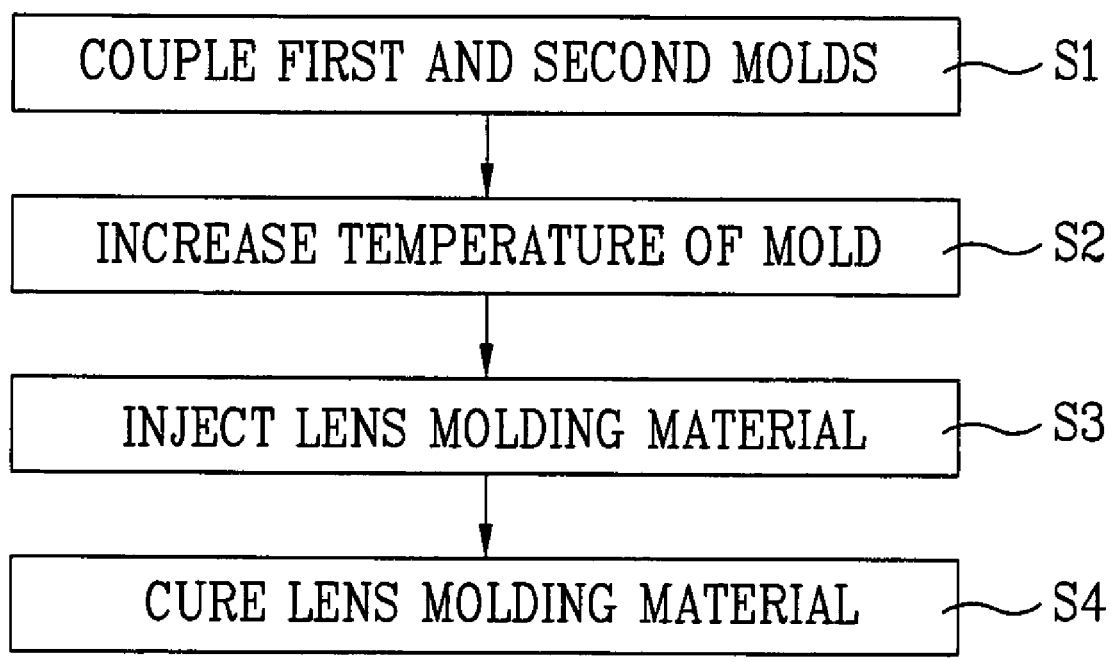
FIG. 8 is a flow chart for explaining a light emitting unit manufacturing method according to the present invention.

As shown in FIG. 8, the light emitting unit 200 is first arranged between the first mold 110 and the second mold 120 such that the LEDs or LED packages of the light emitting unit 200 are aligned with the grooves 111 or 121. In this state, the first and second molds 110 and 120 are coupled to each other (S1).

Thereafter, the first and second molds 110 and 120 are heated to increase the temperatures of the first and second molds 110 and 120 (S2). The reason why the temperatures of the first and second molds 110 and 120 should be increased is to prevent the lens-molding liquid material injected through the injection port 123 from being cured during flowing of the liquid material through the passage 122.

The lens-molding liquid material is then injected into the lens-shaped grooves 111 or 121 (S3). In this case, the injection of the lens-molding liquid material can be uniformly achieved because the lengths of the passage 12 from the injection port 123 to respective grooves 111 or 121 are identical, as described above.

As described above, it is preferred that the lens-molding liquid material injected through the injection port 123 be an epoxy resin or a silicon resin. This is because the epoxy resin and silicon resin are thermosetting materials, so that they are not deformed even at a high temperature of the mold 100.

Subsequently, the liquid material injected into the lens-shaped grooves 111 or 121 through the injection port 123 and passage 122 is cured (S4).

Finally, the first and second molds 110 and 120 are separated from each other. Thus, a direct molding process is completed. In accordance with the direct molding process, a light emitting unit 200 integrally formed with lenses can be manufactured.

In the light emitting unit 200 manufactured in the above-described manner, there is no interface between the PCB, on which LED packages or LEDs are mounted, to constitute the light emitting unit 200, and each lens, because the lenses are integrally formed on the light emitting unit 200.

That is, no adhesive coating process is required for bonding of lenses to the light emitting unit 200. Accordingly, there is no interface, for example an adhesive interface, between the light emitting unit 200 and each lens.

The lenses molded in accordance with the above-described direct molding process may function as fillers on the light emitting unit 200. In this case, the fillers and lenses may be considered as being simultaneously formed using a material such as an epoxy resin or a silicon resin.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A light emitting unit manufacturing apparatus comprising:
    a mold including a first mold and a second mold coupled to each other under a condition in which at least one light emitting unit is interposed between the first and second molds;
    a groove formed in one of the first and second molds at a position facing the light emitting unit, the groove having a lens shape;
    a passage extending from an outer surface of the mold to the groove; and
    a board protector arranged in a region where the light emitting unit comes into contact with the first mold or the second mold,
    wherein the board protector is formed around the lens-shaped groove.

2. The light emitting unit manufacturing apparatus according to claim 1, wherein the at least one light emitting unit comprises a plurality of light emitting units, and the groove comprises a plurality of grooves.

3. The light emitting unit manufacturing apparatus according to claim 2, wherein the grooves have different shapes, respectively.

4. The light emitting unit manufacturing apparatus according to claim 2, wherein the plurality of light emitting units and the plurality of grooves are grouped into groups each including at least two of the light emitting units and at least two of the grooves.

5. The light emitting unit manufacturing apparatus according to claim 1, wherein the light emitting unit comprises at least one light emitting diode package.

6. The light emitting unit manufacturing apparatus according to claim 5, wherein the light emitting diode package is mounted on a printed circuit board.

7. The light emitting unit manufacturing apparatus according to claim 1, further comprising:
    an injection port formed at the outer surface of the mold connected to the passage.

8. The light emitting unit manufacturing apparatus according to claim 7, wherein the groove comprises a plurality of grooves, and the passage is branched into branch passages respectively extending from the injection port to the grooves.

9. The light emitting unit manufacturing apparatus according to claim 7, wherein the lengths of the branch passages respectively extending from the injection port to the grooves are substantially same.

10. The light emitting unit manufacturing apparatus according to claim 1, wherein the groove and the passage are formed in the first mold.

11. The light emitting unit manufacturing apparatus according to claim 1, wherein the groove is formed in the first mold, and the passage is formed in the second mold.

12. The light emitting unit manufacturing apparatus according to claim 1, wherein the board protector is made of an elastic material.

13. The light emitting unit manufacturing apparatus according to claim 1, wherein the board protector is formed at the light emitting unit.

14. An apparatus for molding lenses on light emitting units, compnsing:
    a mold including a first mold and a second mold coupled to each other under a condition in which the light emitting units are interposed between the first and second molds;
    grooves formed in one of the first and second molds at positions facing the light emitting units, respectively, each groove having a lens shape;
    a passage extending from an outer surface of the mold to the grooves; an injection port connected to the passage; and
    a board protector arranged in a region where the light emitting unit comes into contact with the first mold or the second mold.
    wherein the board protector is located on a printed circuit board of the light emitting unit or on the second mold.

15. The apparatus according to claim 14, wherein the light emitting units and the grooves are grouped into groups each including at least two of the light emitting units and at least two of the grooves.

16. The apparatus according to claim 15, wherein the passage comprises:
    first passages each extending from the injection port to an entrance of an associated one of the groups where the grooves of the associated group are distributed; and
    second passages branched from each first passage, and respectively connected to the grooves of the group associated with the first passage.

17. The light emitting unit manufacturing apparatus according to claim 1, wherein the board protector is located on a printed circuit board of the light emitting unit or on the secont mold.

* * * * *